United States Patent [19]
Goodman et al.

[11] Patent Number: 5,477,419
[45] Date of Patent: Dec. 19, 1995

[54] METHOD AND APPARATUS FOR ELECTRICALLY CONNECTING AN ELECTRONIC PART TO A CIRCUIT BOARD

[75] Inventors: Thomas W. Goodman, Kanagawa; Hiroyuki Fujita, Tokyo; Yoshikazu Murakami, Kanagawa; Arthur T. Murphy, Tokyo, all of Japan

[73] Assignee: Sony Corporation, Tokyo, Japan

[21] Appl. No.: 226,049

[22] Filed: Apr. 11, 1994

[30] Foreign Application Priority Data

Apr. 8, 1993 [JP] Japan ................................. 5-104920

[51] Int. Cl.$^6$ ................................. H05K 7/02
[52] U.S. Cl. ................. 361/760; 361/767; 361/807; 228/254; 29/840; 174/263
[58] Field of Search ................. 361/748, 767, 361/774, 808, 807; 228/180.2, 254; 29/840, 843, 825, 830; 174/68.5, 260, 263

[56] References Cited

U.S. PATENT DOCUMENTS 4,914,814  4/1990  Behun et al. ........................ 29/843
5,186,383  2/1993  Melton et al. ..................... 228/180.2

OTHER PUBLICATIONS

Hodson, "Dispensing Surface Mount Adhesives and Solder Pastes", Electronic Packaging and Production, Newton, Mass., vol. 31, No. 11, pp. 36–40, Nov. 1990.

Hertz et al, "Solder Embossed PCB Location For Debossed Component", Motorola Technical Developments, Schaumburg, Ill., vol. 16, pp. 89–90, Aug. 1992.

*Primary Examiner*—Leo P. Picard
*Assistant Examiner*—Y. Whang

[57] ABSTRACT

A method of mounting an electronic part having a terminal portion on a board on which a circuit including a connection portion is formed. It includes a process of forming a conductive layer on the surface of the terminal portion; a process of forming, on the surface of the connection portion, a conductive layer having a melting point different from that of the conductive layer formed on the surface of the terminal portion; and a process of melting the conductive layer having a low melting point in such a state that the conductive layer of the terminal portion is contacted with the conductive layer of the connection portion, thereby fusing the conductive layer having a low melting point onto the conductive layer having a high melting point. Moreover, the method includes a process of forming a projecting portion made of a heat-resisting material on the surface of the electronic part around the terminal portion, and forming a conductive layer at least one surface of the connection portion or the terminal portion; and a process of electrically connecting the connection portion with the terminal portion and allowing the projecting portion to be contacted with the surface of the board.

25 Claims, 5 Drawing Sheets

METHOD AND APPARATUS FOR ELECTRICALLY CONNECTING AN ELECTRONIC PART TO A CIRCUIT BOARD

BACKGROUND OF THE INVENTION

1. Field of the Invention

The present invention relates to a new electronic part mounting board and electronic part mounting method.

2. Description of the Related Art

Along with the tendency toward the miniaturization and enhanced performance of electronic devices, the high density mounting of electronic parts such as positive/passive devices have been required. To meet the requirements of the high density mounting, the miniaturization of the electronic parts and the narrowed pitch of a terminal portion have been advanced. Additionally surface mounting technique has been developed. A conventional lead insertion system includes the steps of providing lead holes on a printed wiring board; passing lead wires of an electronic part through the lead holes; and soldering connection portions of a circuit provided on the printed wiring board on the side opposed to the electronic part with the lead wires of the electronic part. On the other hand, surface mounting technique is generally known as methods of directly electrically connecting/joining each connection portion formed on a printed wiring board with each terminal portion provided on an electronic part, without any lead hole for passing each lead wire of the electronic part to the printed wiring board therethrough.

Examples of the electronic parts used in the surface mounting technique include an angular chip part of leadless type or mini-mold type, a cylindrical chip part of leadless type, a part with a two-way lead such as SOP or SOJ, a part with a four-way lead such as QFP or PLCC, or a land grid array (LGA) package.

One of the electronic part mounting methods in the surface mounting technique is a solder reflow method. In this method, solder layers are provided on each terminal portion of the electronic part and on each connection portion of a circuit provided on a printed wiring board. In such a state that the solder layer formed on the terminal portion is contacted with the solder layer formed on the connection portion, the solder layers are heated into reflow, to be fused to each other, thus electrically connecting the terminal portion of the electronic part to the connection portion of the board.

Figure 1:
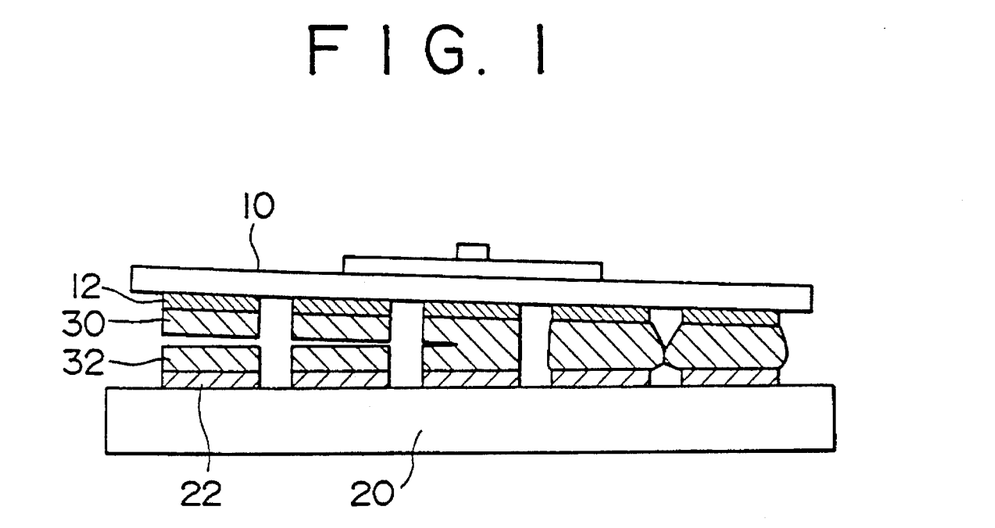
FIG. 1 is a view for explaining problems in a conventional electronic part mounting method.

In the conventional solder reflow method, the solder formed on the terminal portion of the electronic part and the solder layer formed on the connection portion of the circuit are both melted (reflow). For example, in an electronic part such as an LGA package, a lot of terminal portions are formed on the surface of the package. Accordingly, in the case of using the above solder reflow method, as is typically shown in FIG. 1, depending on the degree of the contact between a solder layer 30 formed on a terminal portion 12 of an electronic part 10 and a solder layer 32 formed on a connection portion 22 of a board 20, or depending on the degree of the smoothness of the board 20 such as a printed wiring board, the solder layer causes crushing upon the reflow of the solder layer, which brings about a problem in generating connection failure between the terminal potion and the connection portion after the reflow of the solder layer, or in making the interval between the electronic part and the printed wiring board unstable. Moreover, upon the reflow of the solder layer, a short-circuit may be generated between the adjacent terminal portions or the connection portions.

A flip-chip system has been known as a bear chip mounting technique of mounting a semiconductor bear chip on a board as it is (not packaged). The flip-chip system includes a CCB (Controlled Collapse Bonding), which is often called C4 process. In this CCB method, a spherical connection bump called a solder bump is formed on each terminal portion of a semiconductor bear chip, while a solder layer is formed on the surface of each connection portion of a circuit of the board. In general, the solder bump has a melting point higher than the solder layer formed on the surface of the connection portion of the circuit of the board.

In such a state that the solder bump is contacted with the solder layer formed on the connection portion of the circuit, the reflow treatment is made such that the solder bump is not melted and only the solder layer formed on the surface of the connection portion is melted, thus electrically connecting the terminal portion to the connection portion.

The above CCB method is adopted at present as a mounting method for a semiconductor bear chip on a board; however, there has been not known the case that the CCB method has been used for an electronic part such as the LGA package having a size being 100 times or more as much as that of the semiconductor chip.

OBJECT AND SUMMARY OF THE INVENTION

Accordingly, an object of the present invention is to provide an electronic part mounting board and an electronic part mounting method capable of certainly electrically connecting an electronic part such as a land grid array package to a board such as a printed wiring board.

To achieve the above object, according to a first aspect of the present invention, there is provided an electronic part mounting board including an electronic part having a terminal portion and a board on which a circuit including a connection portion is formed, wherein the terminal portion is electrically connected to the connection portion. A conductive layer is formed on the surface of the terminal portion, and a conductive layer having a melting point different from that of the conductive layer formed on the surface of the terminal portion is formed on the surface of the connection portion. In this case, the conductive layer having a low melting point is fused onto the conductive layer having a high melting point.

In the electronic part mounting board according to the first aspect of the present invention, the conductive layer is preferably made of a solder or a solder paste. Moreover, the conductive layer having a high melting point is preferably formed in a bump shape. As the combination of the electronic part and the board, there may be used a combination of a land grid array package and a printed wiring board.

Moreover, according to the first aspect of the present invention, there is provided an electronic part mounting method for mounting an electronic part having a terminal portion on a board on which a circuit including a connection portion is formed. It includes a process of forming a conductive layer on the surface of the terminal portion; a process of forming, on the surface of the connection portion, a conductive layer having a melting point different from that of the conductive layer formed on the surface of the terminal portion; and a process of melting the conductive layer having a low melting point in such a state that the conductive layer of the terminal portion is contacted with the conductive layer of the connection portion, thereby fusing the conductive layer having a low melting point onto the conductive layer having a high melting point.

In the electronic part mounting method according to the first aspect of the present invention, the conductive layer having a high melting point is preferably formed in a bump shape. As the combination of the electronic part and the board, there may be used a combination of a land grid array package and a printed wiring board.

In the case that the conductive layer is constituted of a solder paste, the process of forming the conductive layer on the surface of the terminal portion or the connection portion includes, for example a process (A) of printing a solder paste on the surface of the terminal portion or the connection portion by a printing method such as screen printing or stencil printing, or a process (B) of imparting a solder paste on the surface of the terminal portion or the connection potion by a dispenser or pin.

In the case that the conductive layer is comprised of a solder, the process of forming the conductive layer on the surface of the terminal portion or the connection portion includes, for example a process (C) of imparting a solder ball on the surface of the terminal portion or the connection portion by a dispenser, or a process (D) of covering the terminal potion or the connection portion with a molten solder, or a process (E) of carrying out a solder plating.

To achieve the above object, according to a second aspect, there is provided an electronic part mounting board including an electronic part having a terminal portion and a board on which a circuit including a connection portion is formed, wherein the terminal portion is electrically connected to the connection portion. A conductive layer is formed on the connecting section between the terminal potion and the connection portion. A projecting portion made of a heat-resisting material, which is contacted with the surface of the board, is formed on the surface of the electronic part around the terminal portion. The conductive layer is preferably made of a solder, solder paste or conductive paste. As the combination of the electronic part and the board, there may be used a combination of a land grid array package and a printed wiring board.

Moreover, according to the second aspect of the present invention, there is provided an electronic part mounting method for mounting an electronic part having a terminal portion on a board on which a circuit including a connection portion is formed. It includes a process of forming a projecting portion made of a heat-resisting material on the surface of the electronic part around the terminal portion and forming a conductive layer at least one surface of the connection portion and the terminal portion; and a process of electrically connecting the connection portion to the terminal portion, for allowing the projecting portion to be contacted with the surface of the board. As the combination of the electronic part and the board, there may be used a combination of a land grid array package and a printed wiring board.

In the case that the conductive layer is constituted of a solder paste or conductive paste, the process of forming the conductive layer on the surface of the terminal portion or the connection portion includes, for example a process (A) of printing a solder paste or conductive paste on the surface of the terminal portion or the connection portion by a printing method, or a process (B) of imparting a solder paste or conductive paste on the surface of the terminal portion or the connection portion by a dispenser or pin.

In the case that the conductive layer is constituted of a solder, the process of forming the conductive layer on the surface of the terminal portion or the connection portion includes, for example a process (C) of imparting a solder ball on the surface of the terminal portion or the connection portion by a dispenser, or a process (D) of covering the terminal potion or the connection portion with a molten solder, or a process (E) of carrying out a solder plating.

In addition, as the electronic part, there may be used an angular chip part of leadless type or mini-mold type, a cylindrical chip part of leadless type, a part with two-way lead such as SOP or SOJ and a part with four-way lead such as QFP or PLCC.

In the case that the board of the present invention comprises a printed wiring board, the insulating layer may be made of a polymer such as polyimide resin, modified polyimide resin, epoxy resin, imide modified epoxy resin, bismaleimide-triazine resin, aralkyl ether resin, polyvinylphenol resin, fluororesin, or PPO resin; a material of the above polymer which is impregnated in a reinforcing material such as a glass fabric or glass nonwoven fabric; or a polyimide film. As the board, there may be used a ceramic board fabricated by simultaneously baking a plurality of laminated ceramic green seats, and a metal core board obtained by forming an insulating layer on a metal base such as aluminum or iron and forming a circuit thereon.

The solder or solder paste may use an alloy system such as Sn—Pb alloy, Sn—Pb—Ag alloy, Sn—Pb—Bi alloy, Sn—Pb—Sb alloy, Sn—Ag alloy, Sn—In alloy, Sn—Sb alloy, Pb—In alloy, Pb—Ag alloy, Pb—Sb alloy, Pb—Sn—In alloy, Pb—Ag—In alloy, Pb—Au alloy, or In—Ag alloy. The conductive paste, may be a conductive paste mainly containing silver or copper.

The difference in the melting point between the conductive layers means that, for example, when the conductive layers made of solders are heated at a certain temperature, one conductive layer is melted and the other conductive layer is not melted. For example, by examining the solidus line and the liquidus line of each conductive layer by a differential thermal analysis or by heating an electronic part mounting board in a furnace or the like and examining the melting state of each conductive layer, the difference in the melting point between the conductive layers can be evaluated.

In the electronic part mounting board and the electronic part mounting method according to the first aspect of the present invention, the melting point of the conductive layer formed on the surface of the terminal portion is different from that of the conductive layer formed on the surface of the connection portion. Accordingly, when the conductive layer having a low melting point is melted, the conductive layer having a high melting point keeps in its shape, thus making it possible to keep constant the interval between the electronic part and the board. This makes it possible to avoid the problem in generating connection failure between the terminal portion of the electronic part and the connection portion of the circuit provided on the printed wiring board, or the problem in generating short-circuit between the adjacent terminal portions or the connection portions due to the conductive layer.

On the other hand, in the electronic part mounting board and the electronic part mounting method according to the second aspect of the present invention, the projecting portion made of a heat-resisting material is formed on the surface of the electronic part around the terminal portion. Accordingly, when the connection portion is electrically connected to the terminal portion, the projecting portion keeps the interval between the electronic part and the board and further separates the adjacent connection portions or the terminal portions from each other. This makes it possible to avoid the problem in generating connection failure between the terminal portion of the electronic part and the connection portion of the circuit provided on the printed wiring board, or the problem in generating short-circuit between the adjacent terminal portions or the connection portions due to the conductive layer.

DESCRIPTION OF THE PREFERRED EMBODIMENTS

Hereinafter, the present invention will be described by way of embodiments with reference to the drawings.

EMBODIMENT 1

Embodiment 1 concerns an electronic part mounting board according to a first aspect of the present invention. As is typically shown in FIG. 2, an electronic part mounting board 1 includes an electronic part 10 composed of a land grid array package, and a board 20 composed of a printed wiring board. Each terminal portion 12 is formed on the electronic part 10, while a circuit including each connection portion 22 is formed on the board 20. The terminal portion 12 is connected to the connection portion 22.

Figure 2:
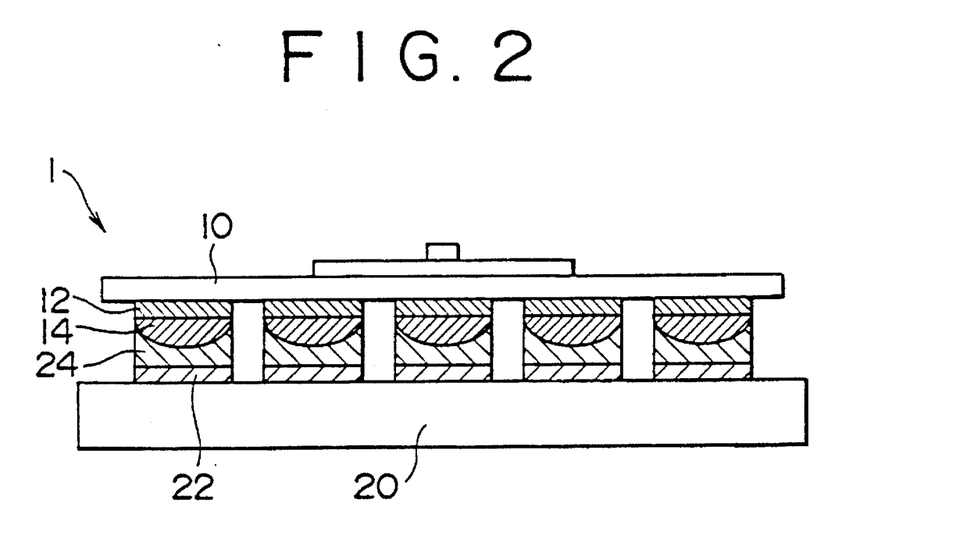
FIG. 2 is a typical view of an electronic part mounting board of a first embodiment.

On the surface of the terminal portion 12 of the electronic part 10, for example, a conductive layer 14 made of a solder containing Pb90%—Sn10% is formed. Meanwhile, on the surface of the connection portion 22 of the circuit of the board 20, a conductive layer 24 made of a solder containing Pb37%—Sn63% is formed. The solder containing Pb90%—Sn10% has a solidus line of 275° C. and has a liquidus line of 302° C., while the solder containing Pb37%—Sn63% has a solidus line of 183° C. and has a liquidus line of 183° C. Accordingly, the melting point of the conductive layer 14 formed on the surface of the terminal portion 12 is different from that of the conductive layer 24 formed on the surface of the connection portion 22. The melting point of a solder can be measured by, for example the known differential thermal analysis.

The conductive layer having a high melting point (in Embodiment 1, the conductive layer 14 made of the solder formed on the surface of the terminal portion 12 of the electronic part 10) is preferably formed in a bump shape. The conductive layer having a low melting point (in Embodiment 1, the conductive layer 24 made of the solder formed on the surface of the connection portion 22 of the board 20) is fused onto the conductive layer having a high melting point.

The electronic part mounting board 1 of Embodiment 1 can be fabricated by the following electronic part mounting method according to a first aspect of the present invention.

Figure 3A:
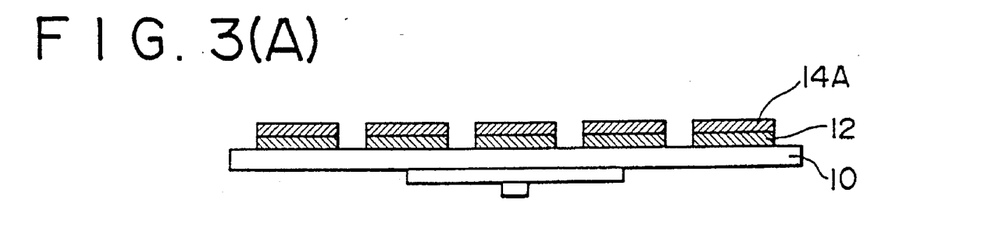
FIGS. 3(A) to 3(D) are a process diagram for explaining the electronic part mounting board of the first embodiment.
Figure 3B:
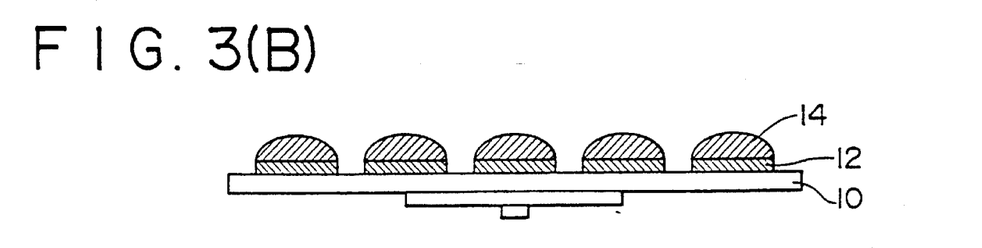

First, on the surface of each terminal portion 12 of an electronic part 10 composed of an LGA package, a solder paste 14A is screen-printed by a conventional manner (see FIG. 3(A)). The solder paste is mainly composed of a solder powder containing Pb90%—Sn10%. The solder paste 14A is then heated into reflow, so that the conductive layer 14 composed of the solder paste formed on the surface of the terminal portion 12 of the electronic part 10 is formed in a bump shape (see FIG. 3(B)).

Figure 3C:
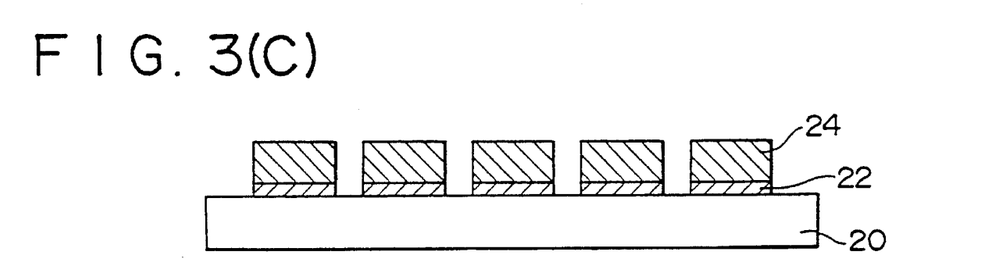

On the other hand, for example, a glass-epoxy resin-copper laminating board is etched, to fabricate a substrate 20 on which a circuit including each connection portion 22. A solder paste is screen-printed on the surface of the connection portion 22 by a conventional manner, to form a conductive layer 24 (see FIG. 3(C)). The solder paste is mainly composed of a solder power containing Pb37%—Sn63%.

Figure 3D:
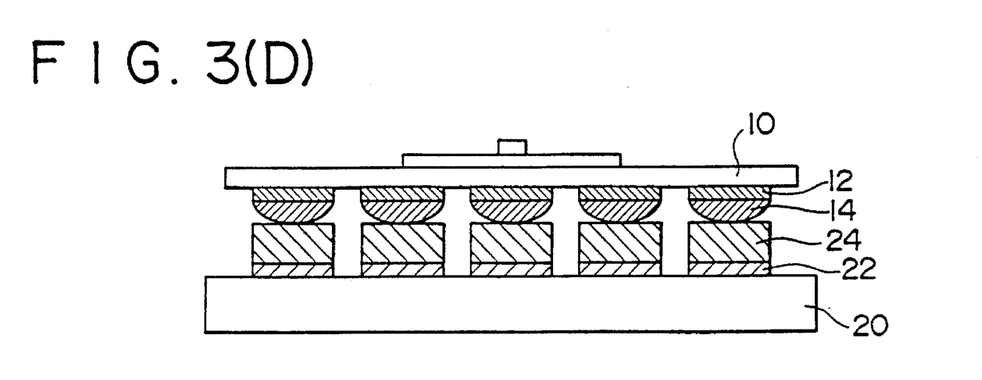

After that, in such a state that the conductive layer 14 of the terminal portion 12 of the electronic part 10 is contacted with the conductive layer 24 of the connection portion 22 of the board 20 (see FIG. 3(D)), the conductive layer 24 is melted (in Embodiment 1, reflow), to be fused onto the conductive layer 14. The melting (reflow) of the conductive layer 24 can be performed by the known method such as infrared-ray heating, saturated vapor heating or hot air heating (air reflow). In summary, there may be used a method of allowing the conductive layer having a low melting point to be melted and the conductive layer having a high melting point not to be melted. The electronic part mounting board shown in FIG. 2 can be thus fabricated. In Embodiment 1, the conductive layers 14 and 24 are formed by the screen printing method using the solder paste; however, they may also be formed by a stencil printing method.

Figure 4A:
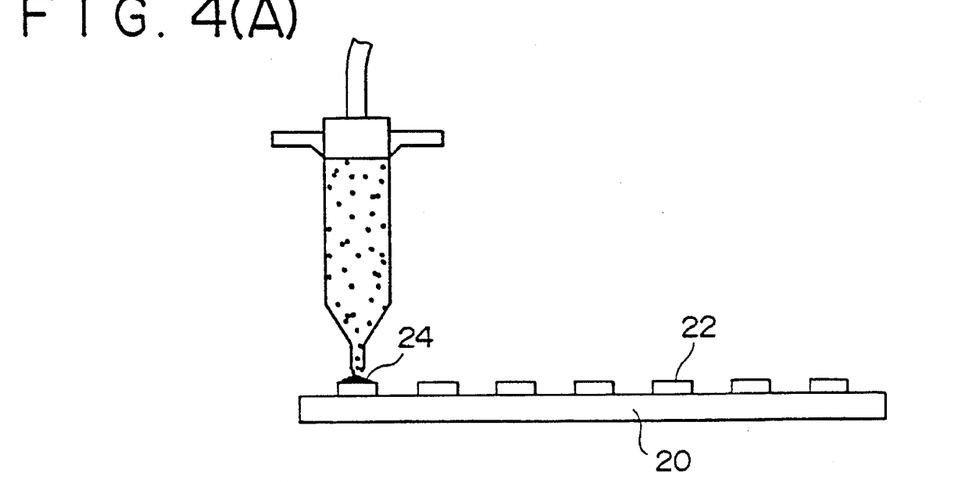
FIGS. 4(A) to 4(C) are views for explaining another electronic part mounting method of the first embodiment.

As is typically shown in FIG. 4(A), there may be adopted the so-called dispenser discharge method of filling a cylindrical dispenser with a solder paste; discharging and imparting a solder paste in a specified amount from the dispenser by a pulse of compressed air or the like; and forming a conductive layer on the surface of the terminal portion 12 of the electronic part 10 or the surface of the connection portion 22 of the board 20.

Figure 4B:
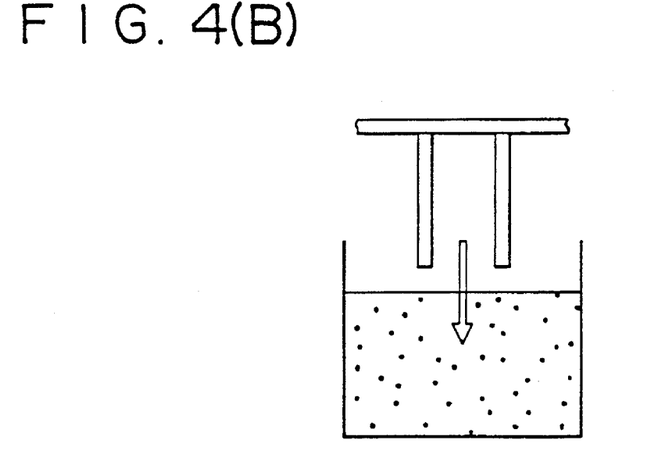
Figure 4C:
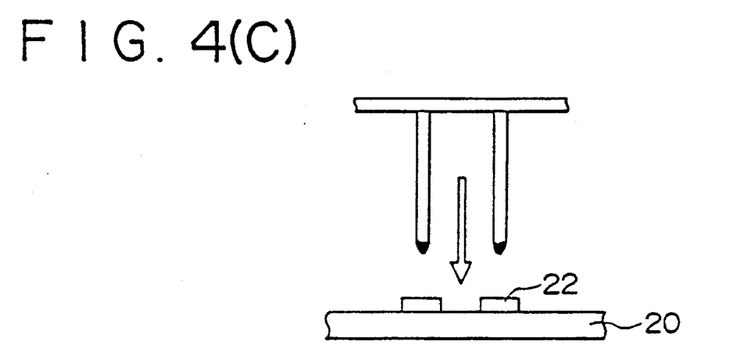

Moreover, there may be adopted the so-called pin transfer method of dipping a pin in a solder paste within a solder paste supply tray for sticking the solder paste on the pin, as is typically shown in FIG. 4(B); and transferring/imparting the solder paste stuck on the pin on the surface of the terminal portion 12 of the electronic part 10 or the surface of the connection portion 22 of the board 20, as is typically shown in FIG. 4(C). In the dispenser discharge method and the pin transfer method, as needed, formed conductive layer is subjected to the reflow treatment, to form the bump-shaped conductive layer.

Figure 5A:
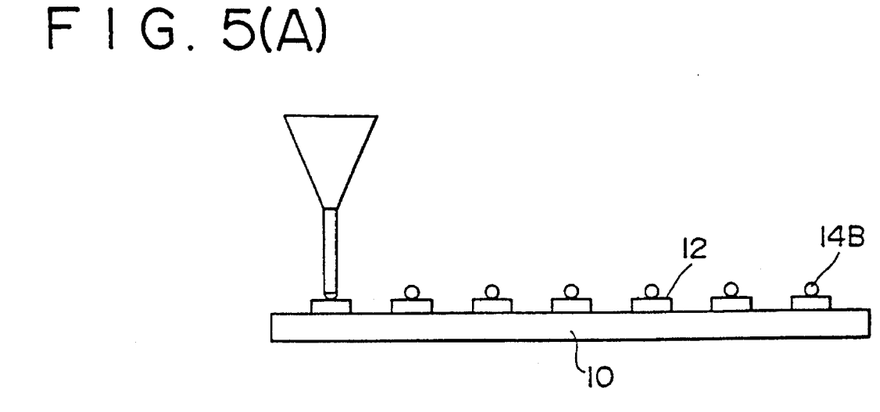
FIGS. 5(A) to 5(B) are views for explaining a further electronic part mounting method of the first embodiment.

Alternatively, in the case that a conductive layer is constituted of a solder, as is typically shown in FIG. 5(A), a solder ball 14B is imparted by a dispenser on the surface of the terminal portion 12 of the electronic part 10 or the surface of the connection portion 22 of the board 20. After that, the solder ball 14B is subjected to an ultrasonic bonding treatment, to form a conductive layer on the surface of the terminal porion 12 of the electronic part 10 or the surface of the connection portion 22 of the board 20.

Figure 5B:
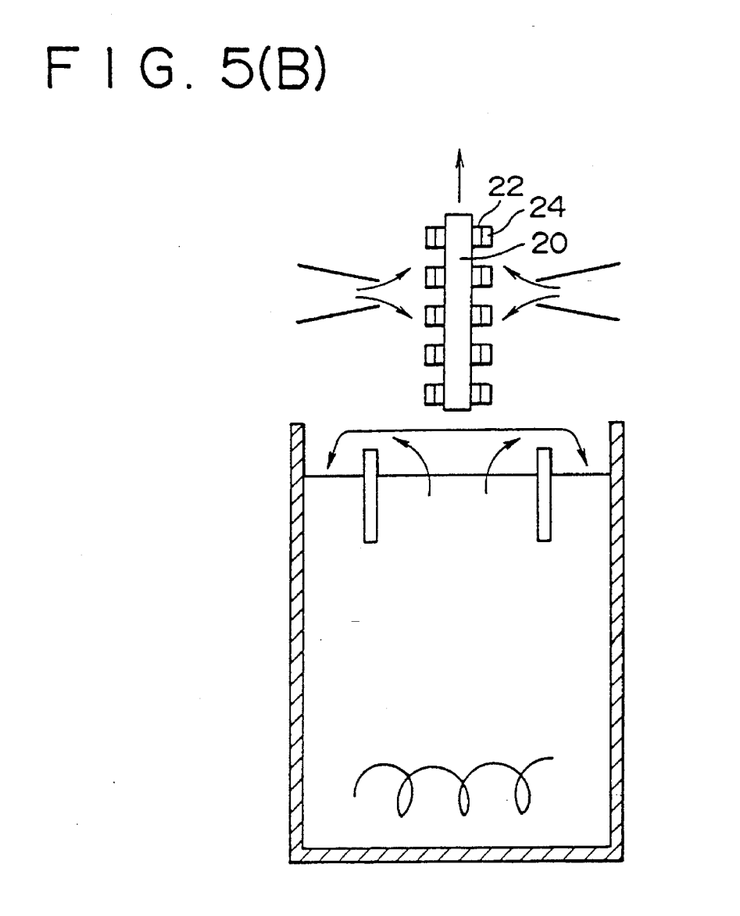

Moreover, in the case that a conductive layer is constituted of a solder, there may be adopted a solder leveller method of dipping the terminal portion 12 of the electronic part 10 or the connection portion 22 of the board 20 in a molten solder for covering it with the molten solder, as is typically shown in FIG. 5(B); and blasting hot air to the terminal portion 12 or the connection portion 22, as needed, for removing unnecessary solder, thereby forming a conductive layer on the surface of the terminal portion 12 of the electronic part 10 or the surface of the connection portion 22 of the board 20.

Alternatively, in the case that a conductive layer is constituted of a solder, the conductive layer can be formed on the surface of the terminal portion 12 of the electronic part 10 or the surface of the connection portion 22 of the board 20 by the known electrolytic solder plating or electroless solder plating.

EMBODIMENT 2

This embodiment concerns an electronic part mounting board according to a second aspect of the present invention. As is typically shown in FIG. 6, an electronic part mounting board 2 of Embodiment 2 is constituted of an electronic part 10 composed of a land grid array package, and a board 20 composed of a printed wiring board. Each terminal portion 12 is formed on the electronic part 10, while a circuit including each connection portion 22 is formed on the board 20. The terminal portion 12 is electrically connected to the connection portion 22.

Figure 6:
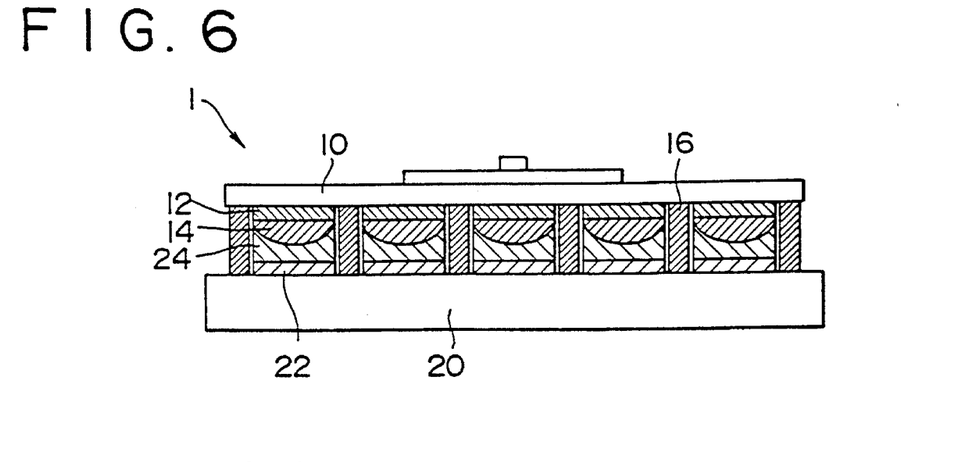
FIG. 6 is a typical view of an electronic part mounting board of a second embodiment.

Each projecting portion 16 made of a heat-resisting material is formed on the surface of the electronic part around the terminal portion 12. The projecting portion is contacted with the surface of the board. The projecting portion is made of a heat-resisting material, for example, ceramic, thermosetting type or ultraviolet ray hardening type solder resist, or photosensitive film. Under the consideration of an interval between the electronic part and the board, heights of the terminal portion and the connection portion, and thickness of the conductive layer, the height of the projecting portion 16 is set such that the projecting portion 16 is certainly contacted with the surface of the board when the connection portion is electrically connected to the terminal portion. The horizontal sectional shape of the projecting portion 16 is freely determined. For example, in the case that the horizontal sectional shapes of the terminal portion and the connection portion are circular, the projecting portion may be formed over the surface of the electronic part except for the terminal portion, or may be formed in a ring shape so as to surround the terminal portion.

Moreover, in Embodiment 2, conductive layers 12 and 24 are respectively formed on the surfaces of the connection portion 12 and the terminal portion 22. Namely, the conductive portions 14 and 24 are formed at the connection portion between the connection portion 22 and the terminal portion 12.

More specifically, the conductive layers 14 and 24 made of a solder containing Pb37%—Sn63% are formed on the surface of the terminal portion 12 of the electronic part 10 and the surface of the connection portion 22 of the circuit of the board 20, respectively. In Embodiment 2, the melting point of the conductive layer 14 formed on the surface of the terminal portion 12 is set to be the same as that of the conductive layer 24 formed on the surface of the connection portion 22; however, the above melting points may be set to be different from each other. In this case, the conductive layer having a high melting point is preferably formed in a bump shape. The melting point of the solder can be measured by, for example the known differential thermal analysis. In the case that the melting point of the conductive layer 14 formed on the surface of the terminal portion 12 is the same as that of the conductive layer 24 formed on the surface of the connection portion 22, the conductive layers 14 and 24 are fused to each other. Meanwhile, in the case that the melting point of the conductive layer 14 formed on the surface of the terminal portion 12 is different from that of the conductive layer 24 formed on the surface of the connection portion 22, the conductive layer having a low melting point is fused onto the conductive layer having a high melting point.

The electronic part mounting board 2 in Embodiment 2 can be fabricated by the following electronic part mounting method according to the second aspect of the present invention.

Figure 7A:
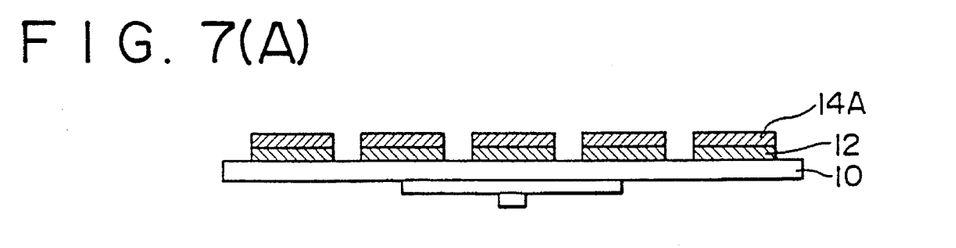
FIGS. 7(A) to 7(C) are a process diagram for explaining an electronic part mounting method of the second embodiment.

First, a solder paste 14A is screen-printed on each terminal portion 12 of an electronic part 10 composed of an LGA package by a conventional manner (see FIG. 7(A)). The solder paste is mainly composed of a solder powder containing Pb37%—Sn63%. After that, the solder paste is subjected to reflow treatment, to form a conductive layer 14 formed in a bump shape.

Figure 7B:
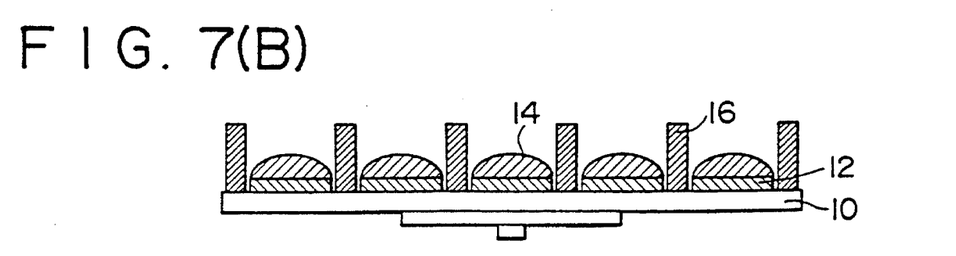

Next, a projecting portion 16 made of a heat-resisting material is formed on the surface of the electronic part 10 composed of the LGA package around the terminal portion 12 (see FIG. 7(B)). As the heat-resisting material, there may be used a thermosetting type or ultraviolet ray hardening type solder resist used for a printed wiring board, or a photosensitive film. For example, the thermosetting type or ultraviolet ray hardening type solder paste is printed on the surface of the electronic part by screen printing, followed by heat treatment or ultraviolet irradiation, to form the projecting portion 16. In addition, the formation of the conductive layer 14 on the surface of the terminal portion 12 and the formation of the projecting portion 16 may be performed in the reversed order, as needed.

Alternatively, in the case that the electronic part is composed of the LGA package, a ceramic seat perforated at the corresponding position to the terminal portion may used as the heat-resisting material. The ceramic seats are laminated on the LGA package using adhesive or the like, to form the projecting portion. Moreover, each ceramic green seat for fabricating the LGA package and each ceramic seat perforated at the corresponding position to the terminal porion are laminated and then simultaneously baked, to form a projecting portion integrated with the LGA package.

Figure 7C:
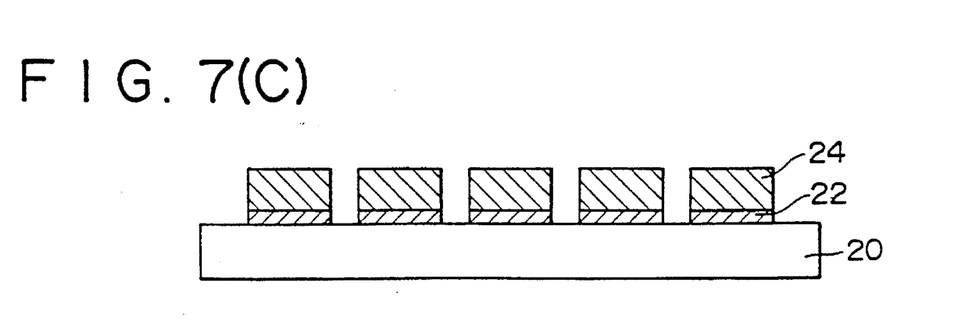

On the other hand, a conductive layer 24 is formed on the connection portion 22 of the circuit formed on the board 20 (see FIG. 7(C)). The conductive layer 24 is made of, for example a solder, and its formation is performed by, for example electrolytic solder plating. In addition, the conductive layer 24 is formed by printing of a solder paste using a printing method.

After that, in such a state that the terminal portion 12 is contacted with the connection portion 22 according to the height relation between the connection portion 22 and the projecting portion 16, or in such a state that the projecting portion 16 is contacted with the surface of the board 20, or in such a state that the terminal portion 12 is contacted with the connection portion 22 and the projecting portion 16 is contacted with the surface of the board 20, the connection portion 12 is electrically connected to the terminal portion 22. More specifically, the conductive layers 14 and 24 formed on the surfaces of the connection portion 12 and the terminal portion 22 are melted and fused using the known method such as infrared ray heating, saturated vapor heating (VPS), hot air heating (air reflow) or the like. After the connection portion 2 is electrically connected to the terminal portion 12, the projecting portion 16 is contacted with the surface of the board 20. In this case, the whole area of the projecting portion is not necessarily contacted with the surface of the board.

In the case that the conductive layer is constituted of a solder paste, the process of forming the conductive layers 14 or 24 on the surface of the terminal portion 12 of the electronic part 10 or the surface of the connection portion 22 of the board 20 may be performed using the so-called dispenser discharge method or the so-called pin transfer method just as in Embodiment 1. In the case that the conductive layer is constituted of a solder, just as in Embodiment 1, there may be adopted the solder leveller method of imparting a solder ball by a dispenser and ultrasonic-bonding the solder ball; and various plating methods.

The conductive layer formed on the surface of the terminal portion 12 of the electronic part 10 or the surface of the connection portion 2 of the board 20 may be constituted of a conductive paste mainly containing silver or copper. In this case, a conductive paste layer is formed on the surface of the terminal portion 12 of the electronic part 10 or the surface of the connection portion 22 of the board 20 by the printing method, dispenser discharge method or the pin transfer method. The conductive paste layer thus obtained is then hardened to form the above conductive layer.

Although the present invention has been described according to the preferred embodiments, it is not limited to these embodiments.

In the electronic part mounting method according to the first aspect of the present invention, the respective conductive layers may be formed in the same manner or the different manners. Moreover, the respective conductive layers may be made of the same kind of material or the different kinds of materials while being different from each other in the melting point. In Embodiment 1, the conductive layer having a high melting point is formed on the terminal portion of the electronic part; however, the conductive layer having a low melting point may be formed on the surface of the terminal portion of the electronic part.

In the electronic part mounting method according to the second aspect of the present invention, the conductive layer may be formed on the surface of either of the connection portion or the terminal portion. In the case that the conductive layers are formed on the respective connection portion and the terminal portion, they may be formed in the same manner or the different manners. The respective conductive layers may be made of the same kind of material or the different kinds of materials. On the surface of the board, for example, a solder resist may be formed. In this case, the projecting portion is contacted with the solder resist formed on the surface of the board.

According to the present invention, the interval between the electronic part and the board can be kept constant. This makes it possible to avoid the problem in generating connection failure between the terminal portion of the electronic part and the connection portion of the circuit provided on the printed wiring board, or the problem in generating short-circuit between the adjacent terminal portions or the connection portions due to the conductive layer.

What is claimed is:

1. An electronic part mounting board comprising:

an electronic part having a terminal portion; and a board on which a circuit including a connection portion is formed, said terminal portion being connected to said connection portion, a first conductive layer applied on a surface of the terminal portion;

a second conductive layer having a melting point lower than that of the first conductive layer formed on the surface of said terminal portion, formed on a surface of said connection portion; and the second conductive layer fused onto the first conductive layer having a higher melting point.

2. An electronic part mounting board according to claim 1, wherein said first and second conductive layers are comprised of a solder paste.

3. An electronic part mounting board according to claim 2, wherein the first conductive layer is formed in a bump shape.

4. An electronic part mounting board according to claim 2, wherein said electronic part comprises a land grid array package, and said board comprises a printed wiring board.

5. An electronic part mounting board according to claim 1, wherein the first conductive layer is formed in a bump shape.

6. An electronic part mounting board comprising:

an electronic part having a terminal portion; and a board on which a circuit including a connection portion is formed, said terminal portion being electrically connected to said connection portion, wherein said electronic part comprises a land grid array package;

said board comprises a printed wiring board;

a bump-shaped conductive layer formed on a surface of the terminal portion;

a second conductive layer having a melting point lower than that of the bump-shaped conductive layer formed on the surface of said terminal portion, formed on the surface of said connection portion; and wherein the second conductive layer fused onto the first conductive layer.

7. An electronic part mounting method for mounting an electronic part having a terminal portion on a board on which a circuit including a connection portion is formed, the method comprising the steps of:

applying a first solder paste on a surface of the terminal portion;

applying a second solder paste on a surface of the connection portion, the second solder paste having a melting point lower than a melting point of the first solder paste; and melting the second solder paste onto the first solder paste.

8. An electronic part mounting method according to claim 7, wherein the first conductive paste is formed in a bump shape.

9. An electronic part mounting method according to claim 7, wherein said electronic part comprises a land grid array package, and said board comprises a printed wiring board.

10. An electronic part mounting method according to claim 9, wherein said conductive layer comprises a solder paste; and said step of applying a first solder paste comprises printing a solder paste on the surface of the terminal portion.

11. An electronic part mounting method according to claim 9, wherein said conductive layer comprises a solder paste; and said process of applying a first conductive paste comprises imparting a solder paste on the surface of the terminal portion with a pin.

12. An electronic part mounting method according to claim 9, wherein said conductive layer comprises a solder; and said step of applying the first solder paste comprises imparting a solder ball on the surface of the terminal portion with a dispenser.

13. An electronic part mounting method according to claim 9, wherein said conductive layer comprises a solder; and said process of forming said conductive layer on the surface of said terminal portion or said connection portion includes a process of covering said terminal portion or said connection portion with a molten solder.

14. An electronic part mounting method according to claim 9, wherein said conductive layer comprises a solder; and said process of forming said conductive layer on the surface of said terminal portion or said connection portion includes a solder plating process.

15. An electronic part mounting board comprising:

an electronic part having a terminal portion; and a board on which a circuit including a connection portion is formed, said terminal portion being connected to said connection porion, wherein a conductive portion is formed on said connecting section between said terminal portion and said connection portion; and a projecting portion made of a heat-resisting material which is contacted with the surface of said board, is formed on the surface of said electronic part around said connection portion.

16. An electronic part mounting method according to claim 15, wherein said conductive layer comprises a solder, a solder paste or a conductive paste.

17. An electronic part mounting method according to claim 15, wherein said electronic part comprises a land grid array package, and said board comprises a printed wiring board.

18. An electronic part mounting board comprising:

an electronic part having a terminal portion; and a board on which a circuit including a connection portion is formed, said terminal porion being electrically connected to said connection portion, wherein said electronic part comprises a land grid array package;

said board comprises a printed wiring board;

a conductive layer made of a solder, solder paste or conductive paste is formed on a connecting section between said terminal portion and said connection portion; and a projecting portion made of a heat-resisting material which is contacted with the surface of said board, is formed on the surface of said electronic part around said connection portion.

19. An electronic part mounting method of mounting an electronic part having a terminal portion on a board on which a circuit including a connection portion is formed, comprising:

a process of forming a projecting portion made of a heat-resisting material on the surface of said electronic part around said terminal portion, and forming a conductive layer at least one surface of said connection portion or said terminal portion; and a process of electrically connecting said connection portion to said terminal portion, and allowing said projecting portion to be contacted with the surface of said board.

20. An electronic part mounting method according to claim 19, wherein said electronic part comprises a land grid array package, and said board comprises a printed wiring board.

21. An electronic part mounting method according to claim 20, wherein said conductive layer comprises a solder paste or conductive paste; and said process of forming said conductive layer on the surface of said terminal portion or said connection portion includes a process of printing a solder paste or conductive paste on the surface of said terminal portion or said connection portion by a printing method.

22. An electronic part mounting method according to claim 20, wherein said conductive layer comprises a solder paste or conductive paste; and said process of forming said conductive layer on the surface of said terminal portion or said connection portion includes a process of imparting a solder paste or conductive paste on the surface of said terminal portion of said connection portion by a dispenser or a pin.

23. An electronic part mounting method according to claim 20, wherein said conductive layer comprises a solder; and said process of forming said conductive layer on the surface of said terminal portion or said connection portion includes a process of imparting a solder ball on the surface of said terminal portion or said connection portion by a dispenser.

24. An electronic part mounting method according to claim 20, wherein said conductive layer comprises a solder; and said process of forming said conductive layer on the surface of said terminal portion or said connection portion includes a process of covering said terminal portion or said connection portion with a molten solder.

25. An electronic part mounting method according to claim 20, wherein said conductive layer comprises a solder; and said process of forming said conductive layer on the surface of said terminal portion or said connection portion includes a solder plating process.

\* \* \* \* \*